United States Patent
Humlum

(10) Patent No.: US 6,476,592 B1
(45) Date of Patent: Nov. 5, 2002

(54) DEVICE AND A METHOD OF METERING AND DISPLAYING ENERGY CONSUMPTION AND A METHOD OF CALIBRATING THE DEVICE

(75) Inventor: Claus Humlum, Them (DK)

(73) Assignee: Humlum Energy Consult A/S, Silkeborg (DK)

( * ) Notice: Subject to any disclaimer, the term of this patent is extended or adjusted under 35 U.S.C. 154(b) by 0 days.

(21) Appl. No.: 09/530,311

(22) PCT Filed: Oct. 28, 1998

(86) PCT No.: PCT/DK98/00467

§ 371 (c)(1),
(2), (4) Date: Apr. 27, 2000

(87) PCT Pub. No.: WO99/23455

PCT Pub. Date: May 14, 1999

(30) Foreign Application Priority Data

Oct. 30, 1997 (DK) ................................................ 1239/97

(51) Int. Cl.$^7$ .......................... G01R 11/32; G01R 11/57; G01R 1/02
(52) U.S. Cl. .......................... 324/74; 324/116; 324/130
(58) Field of Search ................................. 324/142, 116, 324/141, 103 R, 113, 74, 130; 702/60, 85

(56) References Cited

U.S. PATENT DOCUMENTS

| | | | |
|---|---|---|---|
| 3,998,093 A | | 12/1976 | Bertolasi |
| 4,120,031 A | * | 10/1978 | Kincheloe et al. ........... 324/113 |
| 4,253,151 A | * | 2/1981 | Bouve ........................ 324/116 |
| 4,405,987 A | * | 9/1983 | Spalti ..................... 324/103 R |
| 4,465,970 A | * | 8/1984 | DiMassimo et al. ........ 324/116 |
| 4,489,386 A | * | 12/1984 | Breddan ..................... 700/291 |
| 4,686,460 A | | 8/1987 | Stevens et al. |
| 4,881,072 A | * | 11/1989 | Carnel ....................... 324/519 |
| 4,933,633 A | * | 6/1990 | Allgood ...................... 324/142 |
| 4,990,893 A | | 2/1991 | Kiluk |
| 5,315,531 A | * | 5/1994 | Oravetz et al. ............. 324/142 |
| 5,384,712 A | * | 1/1995 | Oravetz et al. ............. 324/142 |
| 5,420,799 A | * | 5/1995 | Peterson et al. ............ 324/142 |
| 5,559,719 A | * | 9/1996 | Johnson et al. ............. 324/520 |
| 6,043,642 A | * | 3/2000 | Martin et al. ............... 324/142 |

FOREIGN PATENT DOCUMENTS

| | | | |
|---|---|---|---|
| DE | 25 53 237 | 6/1977 | |
| DE | 33 20 253 | 12/1984 | |
| FR | 2616227 A1 | * 12/1988 | ................. 324/142 |

\* cited by examiner

Primary Examiner—Michael Sherry
Assistant Examiner—Jermele Hollington
(74) Attorney, Agent, or Firm—Merchant & Gould P.C.

(57) ABSTRACT

A device and a method of metering and displaying immediate and/or accumulated energy consumption at a place of consumption, such as electricity, water or heating consumption in a household, said device comprising a recording unit which records and sums an immediate energy consumption on the basis of regular measurements and stores there measurements for the calculation of an average consumption, a display comprising at least one display unit capable of displaying the relationship between an accumulated energy consumption and the calculated average consumption for a selected period of time on a percentage scale. The display preferably exhibits a first display unit which displays the accumulated energy consumption on an energy scale preferable from 0–200%, where 100% corresponds to the calculated average consumption, and a second display unit which may show the immediate power consumption relative to a selected reference consumption, preferably on a percentage power scale of 0–100%, where the selected reference consumption, which corresponds to 80% on the power scale. A consumption meter according to the invention hereby ensures that the user is more easily motivated to cut down on the energy consumption because of e.g. an energy saving measure, such as the use of low-energy bulbs in one or more lamps or the like.

18 Claims, 4 Drawing Sheets

Figure 1:
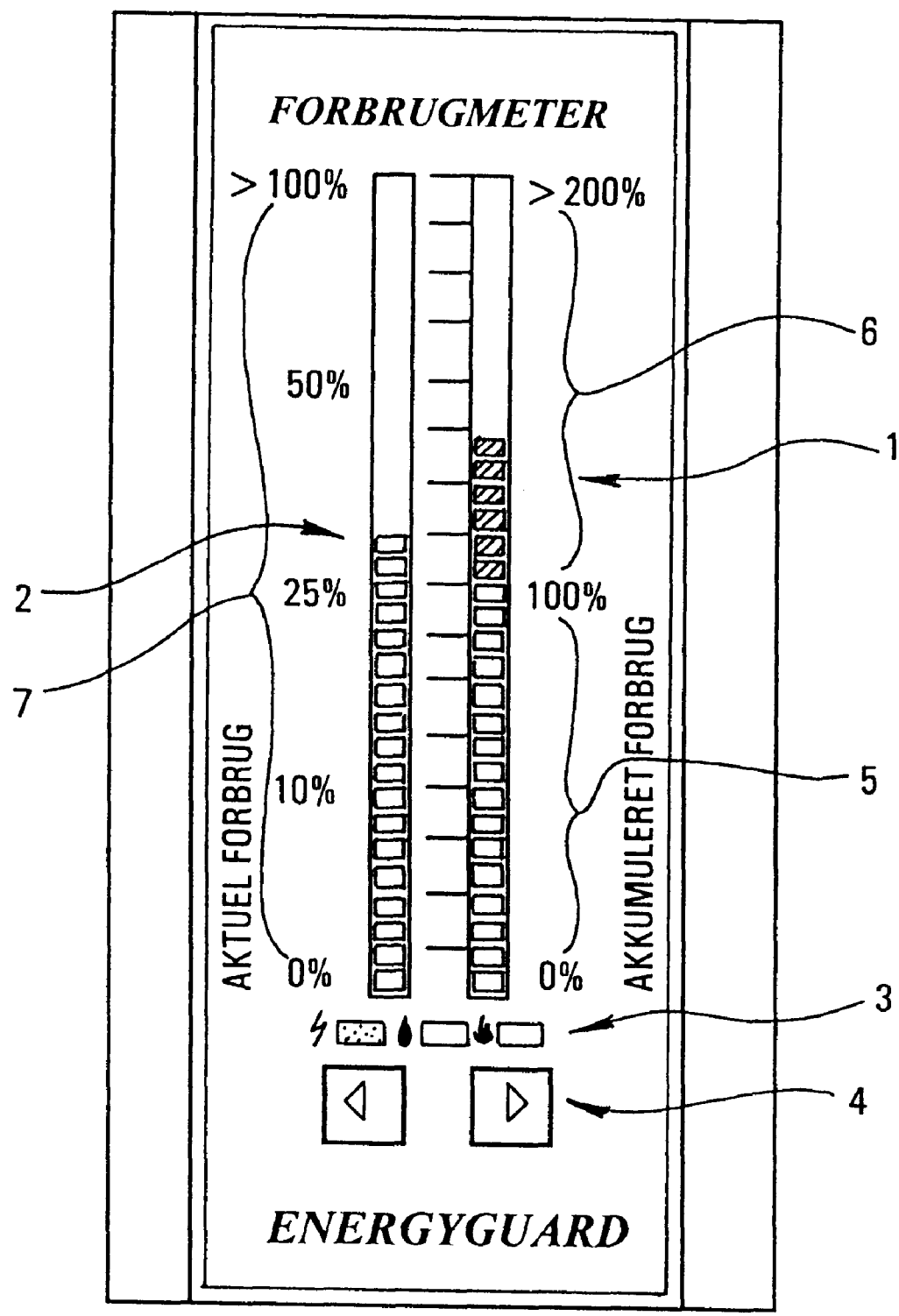

DEVICE AND A METHOD OF METERING AND DISPLAYING ENERGY CONSUMPTION AND A METHOD OF CALIBRATING THE DEVICE

The present invention relates to a device and a method of metering and displaying immediate and/or accumulated energy consumption at a place of consumption, such as electricity, water or heating consumption in a household. The invention moreover relates to a method of calibrating the device.

DE-A1-25 53 237 and DE-A1-33 20 253 disclose devices of the above-mentioned type in which values of consumption are displayed in a plurality of display units, in which each row corresponds to one type of consumption, and each column displays various data for the consumption. It is thus known to display the energy consumption on a display in which the figures displayed indicate the consumption of kilowatt hours (kWh), calories amount ($m^3$) of water or gas, depending on the consumption being metered. In addition to the instantaneous consumption, the figures in the other columns indicate the price per unit of consumption, a previous consumption as well as comparisons of the measurements. It is moreover known from DE-A1-25 53 237 to calculate monthly or annual consumption.

The drawback of these devices is that they are complicated to install, service and read. Installation requires that the device is prepared with average values of the consumption, prices of consumption units, etc. Also, corrections must currently be made for price increases in the consumption units. All this requires a good deal of knowledge about how the device works, just as it is necessary to possess some technical insight in order to operate the device, both at start and at the current data inputs. Moreover, it is a prerequisite that the user, in order to understand the various display units, has a certain knowledge of the various types of consumption. Finally, these devices are extremely exacting in terms of operation and are therefore relatively large. They are therefore difficult to mount, since, owing to other considerations, they will frequently be mounted partly concealed in the rooms in which they are installed.

The closest it is possible to get to such devices is energy meters, e.g. as shown in U.S. Pat. No. 4,686,460, in which a given consumption is displayed by a visual indication and is read by the energy supplier at regular intervals e.g. annually in connection with the billing.

Here, however, there is no form of current display of the energy consumption, so that the consumer can get an overview of his energy consumption and his expenses incurred thereby. This is possible with the initially mentioned devices for the display of the energy consumption.

With these devices, however, it is difficult to get such an overview of the energy consumption, and the invention is therefore intended to provide a device for metering and displaying energy consumption which is simple to read and has a discrete size and design, and which does not require much technical knowledge on the part of the user.

The invention comprises a device and a method of the type mentioned in the opening paragraph, said device comprising a recording unit which, on the basis of regular measurements, records and sums up an intermediate energy consumption and stores these measurements for the calculation of an average consumption, a display comprising at least one display unit capable of displaying, on a percentage scale, the relationship between an accumulated energy consumption and the calculated average consumption for a selected period of time.

This provides a simple device which is self-calibrating through accumulation of periodic measurements, whereby, following a period of time, reference values for the average consumption are automatically accumulated and calculated for this period. With a device for metering and displaying energy consumption according to the invention, the user thus does not need have any knowledge of any data of the consumption history or presumed average and unit prices in order to be able to use the device. Furthermore, it is not necessary to update data when prices are changed. This means that such a "consumption meter" according to the invention can be used also be users without technical skills, as it is easy to read and easy to interpret visually. Thus, with a consumption meter according to the invention, the user will be inspired to cut down on the energy consumption concerned, without possessing previous technical knowledge with respect to the various metering units for the various types of energy consumption.

Since exclusively a percentage scale is used for the display, the consumption meter according to the invention requires no knowledge of which metering units are used, and no knowledge about how absolute values are to be interpreted. This interpretation is performed by the calculations and display of the device. According to the invention, the relationship between the accumulated consumption and an average consumption e.g. for 24 hours is shown. As the consumption increases, the accumulated consumption approaches the average consumption and perhaps exceeds it in percentage. It has thus been realized by the invention that the absolute values of the given energy consumption, such as e.g. the electricity consumption, are not needed at all in order to have a reliable indication of the topical energy consumption in relation to what it usually is.

In the preferred embodiment of the invention, the display moreover has a second display unit capable of displaying the immediate power consumption relative to a selected reference consumption, preferably on a percentage power scale from 0–100%, the selected reference consumption, which corresponds to the maximally recorded power, corresponding to 80% on the power scale. It is hereby ensured with a consumption meter according to the invention that the user will more easily be motivated to cut down on the energy, as he will immediately get a rapid visual indication in his energy consumption because of e.g. an energy saving measure, such as the use of low-energy bulbs in one or more lamps or the like.

In the preferred embodiment of the consumption meter, the accumulated energy consumption is displayed on the first display unit on an energy scale preferably from 0–200%, where 100% corresponds to the calculated average consumption. This means that the user can easily and visually quickly read the display and see how the accumulated energy consumption is relative to the average.

A particularly simple visual representation of the recorded and calculated values may be that the display units are constructed as column displays, each of which is formed by a plurality of linearly arranged light-emitting diodes (LED). This may additionally be made visually readily understandable if the energy scale exhibits LEDs which give out light in a first colour e.g. green, on the lower half of the scale, and the LEDs above 100% on the scale give out light in another colour, e.g. red.

With the consumption meter according to the invention, the period of time for the calculation of the average consumption and the interval of time for the accumulated display may be 24 hours, one week or one month. In the preferred embodiment, the device may be arranged to display the ratio of accumulated energy consumption over 24 hours in one display unit by default, but, by activation of another display function, may instead display history over one week or one month. This may be the immediately preceding month or week or a specific earlier week/month. If it is the latter, another display unit will indicate how many weeks/months the displayed energy consumption dates back.

According to a preferred embodiment of the recording unit, it records the immediate energy consumption using a pulse generator which initiates a measurement preferably every second. Frequent measurements are obtained hereby, and as a result of this the consumption meter according to the invention visualizes even small changes in the energy consumption. This gives the reader a quick and good indication of where energy is used in the household, and the amount contributed by the individual units of consumption, such as refrigerators, ceiling lamps or the like, to the overall consumption.

The consumption meter may moreover be provided with an interface for connection to a computer for exchange of data between the device and the computer. The consumption meter according to the invention may hereby be provided with reference values, if it is not desired to use the self-calibrating function. The interface may moreover be used for the transfer of data from the consumption meter to a PC, if it is desired to perform statistical calculations or the like on the basis of the recorded figures of consumption.

It is realized in connection with the invention that the consumption meter may be used in connection with the display of electricity, water or heating consumption, together with visualization of e.g. gas or oil consumption, just as electricity production from solar cell systems or wind mills may be visualized proportionally relative to e.g. immediate energy consumption, average electricity production or the like.

In the preferred embodiment, the device is provided with an operating panel for the selection of various display functions. In this embodiment, the operating panel comprises two keys which are preferably formed as oppositely directed arrows, by means of which the desired display function may be selected from the sequentially arranged display functions. This ensures simple and easy operation of the consumption meter according to the invention.

The invention also comprises a method of metering and displaying immediate and/or accumulated energy consumption at a place of consumption, such as electricity, water or heating consumption in a household, which is characterized in that an immediate energy consumption is recorded on the basis of regular measurements, and that this measurement is stored and an average consumption is calculated for a given period of time, that an accumulated energy consumption is calculated and displayed on a display which displays, on at least one percentage scale, the relationship between an accumulated energy consumption and the calculated average consumption for a given period of time.

The invention additionally comprises a method of calibrating a device as stated in the foregoing, said method being characterized in that, after the installation of the device, calibration is automatically performed through accumulation of periodic measurements.

Figure 2:
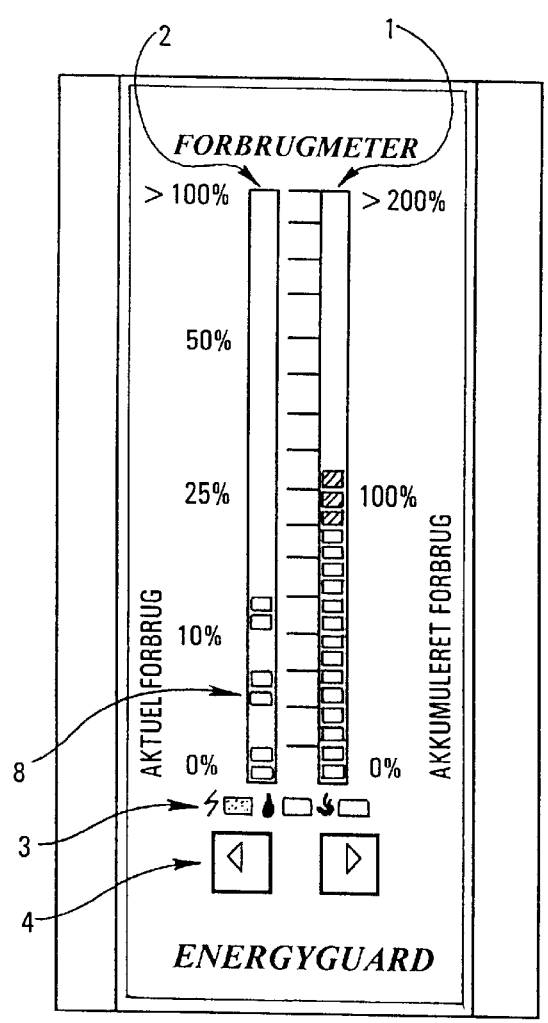
Figure 3:
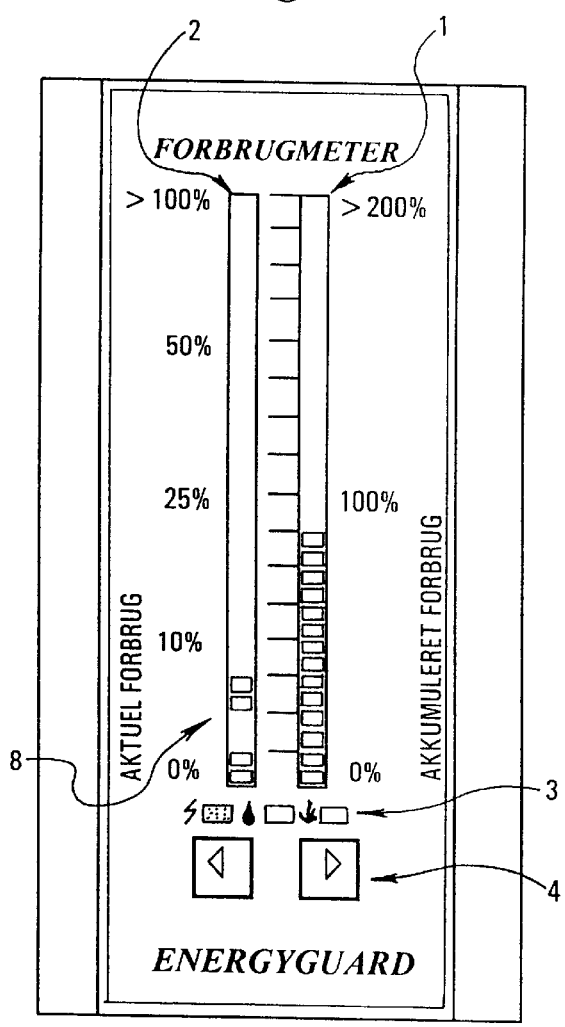
Figure 4:
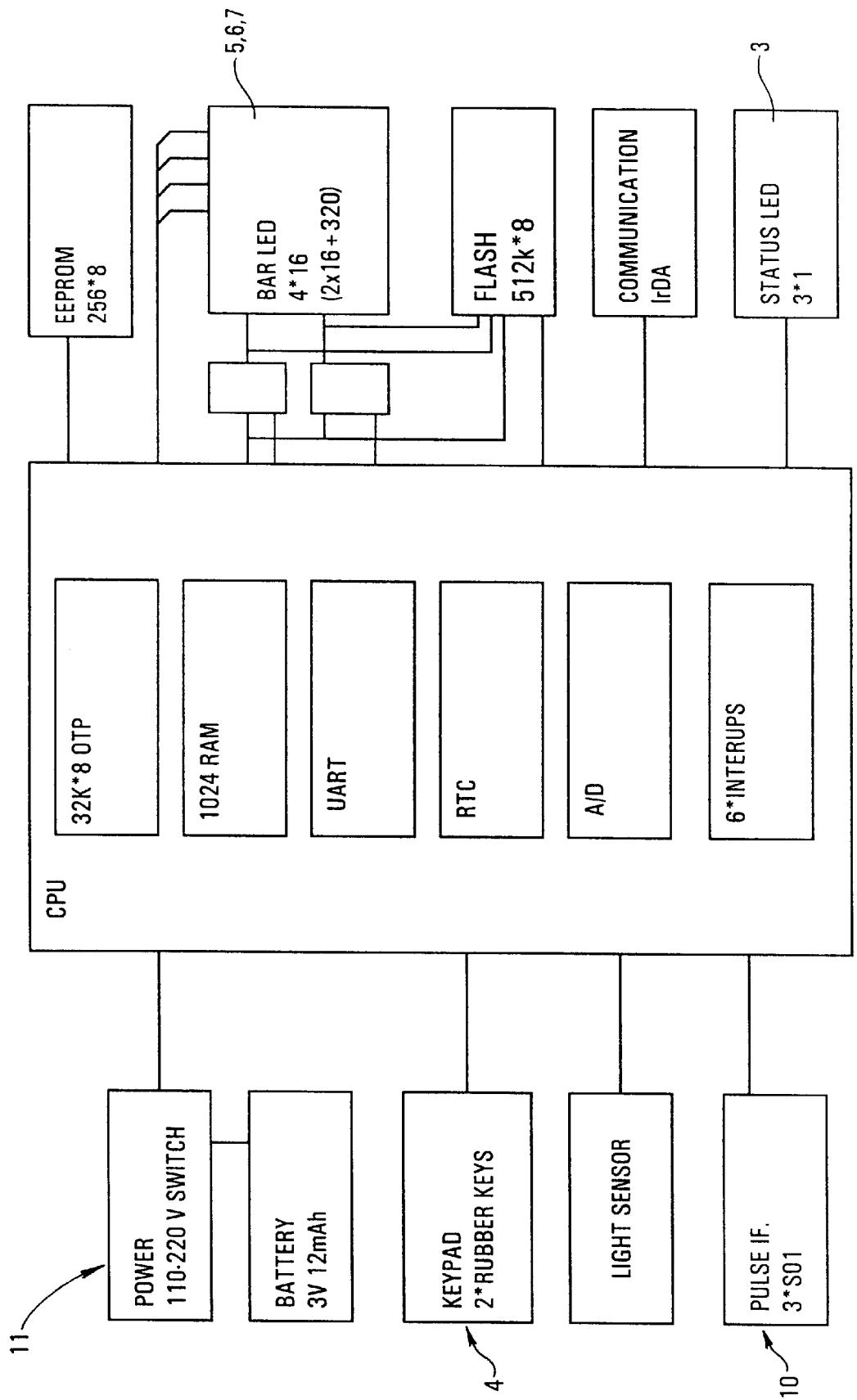
Figure 5:
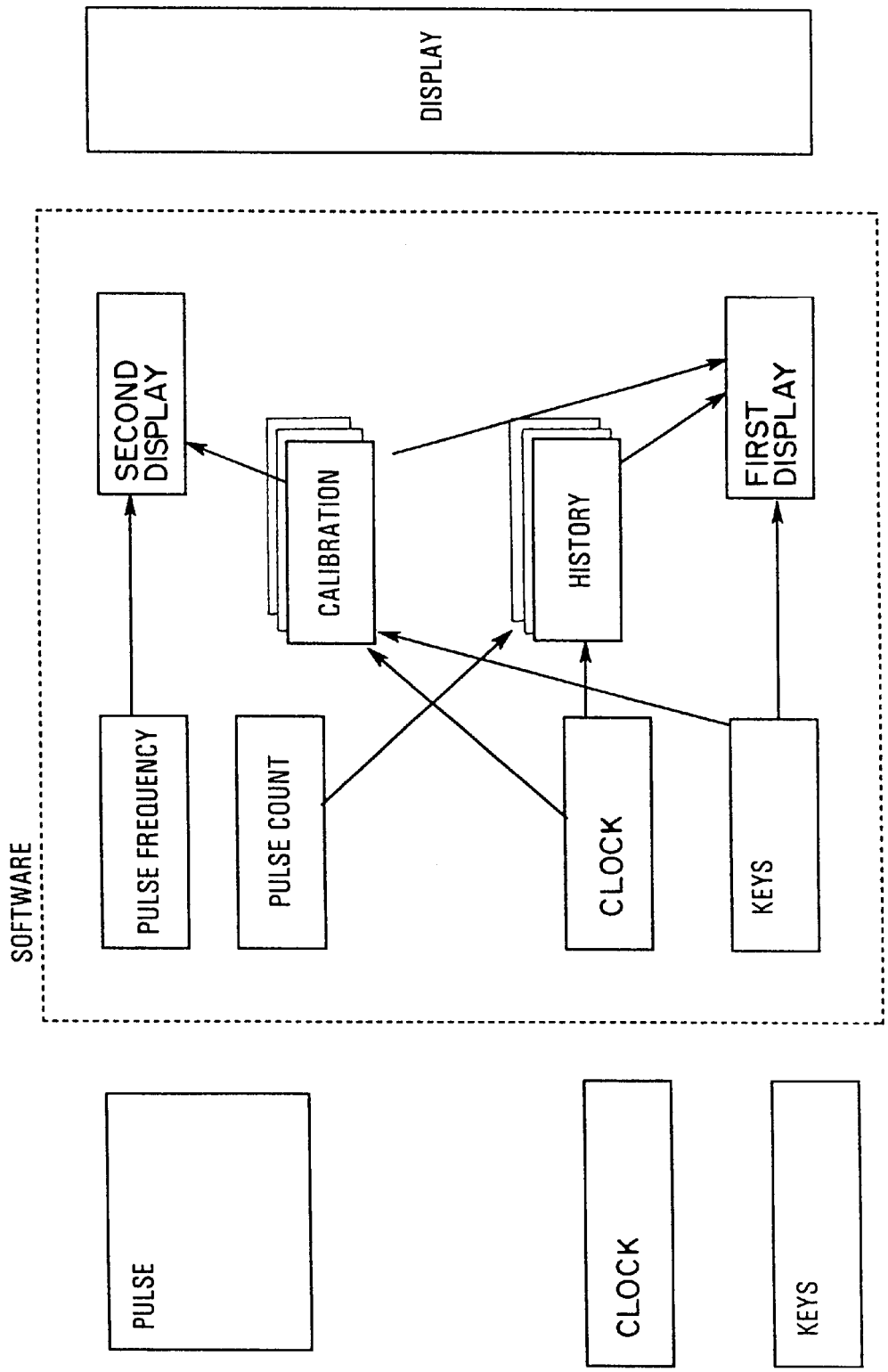

The invention will be described more fully below with reference to the accompanying drawing, in which FIG. 1 shows a device for displaying energy consumption according to the invention, FIGS. 2 and 3 show two display functions in a preferred embodiment of the consumption meter, FIG. 4 shows a basic view of the structure of hardware, and FIG. 5 schematically shows the principles of the structure of software.

FIG. 1 shows the consumption meter in front view. The display has two display columns 1, 2. A status display 3 is arranged below these and comprises, in the embodiment shown, three diodes indicating which measurements are displayed. As is shown in FIGS. 2 and 3, markings may be made in connection with the status display symbols for the various energy types to which the consumption meter is connected, and which may thereby be metered. FIGS. 2 and 3 show an example where the consumption meter is connected for electricity measurement, water measurement and heating measurement, respectively. It will moreover be seen that the first one of the LEDs in the status display gives out light and thereby indicates that electricity consumption is displayed.

An operating panel 4 comprising two arrows keys is moreover arranged on the front of the consumption meter. These keys allow stitching between the various display functions that can be shown, said functions being stored sequentially in a menu.

As will also appear from FIGS. 2 and 3, the display columns 1 and 2 are provided with percentage scales. The scale to the right on the consumption meter is an energy scale from 0–200%, and the left-hand scale is a power scale from 0–100%.

The right-hand display column 1 displays an accumulated energy consumption relative to a calculated average or reference consumption, which is calculated on the basis of the measurements which are recorded and summed up in the recording unit of the device. The left-hand column 2 shows the intermediate energy consumption in a first display function shown in FIG. 1, alternatively the second column 2 may display an indication of time 8 in connection with a display in the first column 1 of the energy consumption in a previous period, such as one day or several days, one week or one month (see FIGS. 2 and 3), said indication of time 8 indicating the age of the displayed energy consumption in the form of the number of days/weeks/months.

The two display columns 1, 2 are formed by a row of light-emitting diodes (LEDs), in a preferred embodiment 32 LEDs in each column. The left-hand display column 2, which shows the immediate consumption in the primary function, consists of 32 preferably green LEDs. The immediate consumption will be updated every second, so that a change in consumption can be detected clearly.

The first display column 1, on the other hand, is composed of 2×16 LEDs in the mentioned embodiment, the diodes arranged in the lower half of the column being green and those above the 100% mark being red. The daily consumption will be shown summed up on this column 1 in the primary function. When 100% of the energy value (the reference consumption or the average consumption) is reached, all the green LEDs will give out light, and a subsequent exceeding of the reference consumption will be shown in red.

The consumption meter according to the invention moreover comprises a recording unit whose structure is outlined in FIGS. 4 and 5. As will appear from FIG. 5 in particular, the hardware comprises the keys 4, the status diodes 3, the LEDs 5, 6, 7 in the display columns 1, 2, a pulse input 10 and a power supply 11. The recording and calculation unit moreover comprises a CPU 16 and a medium for the storage of the recorded and calculated data. The storage includes a registration of consumption history 13 (see FIG. 5). Besides, the software includes a calibration 14 for initiating the system by starting to obtain reference data for the consumption display.

Once the consumption meter has been installed, periodic recording of the energy consumption is automatically started. The recording frequency is determined by a clock 15. The recording comprises a pulse counter 12, where the pulses fed to the consumption meter correspond to an energy unit. By recording the frequency of these pulses and also counting them, it is possible to calculate an average consumption or other form of reference consumption at a selected interval, preferably one week. In case of immediate consumption, e.g., the consumption meter records the highest energy consumption, measured over a period of ten minutes, currently each day in one week. This forms the basis for the calibration of immediate consumption. In case of accumulated consumption, the consumption meter records the accumulated energy consumption currently each day in one week. The average of this forms the basis for the calibration of the 100% scale for accumulated consumption. One week after the installation, the consumption meter will thus automatically have acquired the necessary reference values in order to display accumulated readings. The consumption meter will thus have calibrated itself.

The consumption meter is moreover provided with an interface so that a PC may be connected. "Manual" calibration may alternatively be performed hereby by transferring reference data from the PC to the consumption meter.

It has moreover been realized that the consumption meter may also be used for the display of energy production e.g. in solar cell systems or on a wind mill. The device will be the same, but instead of energy consumption, it will e.g. display the immediate energy production relative to the maximum capacity of the system and the accumulated production relative to average production or optionally relative to the energy consumption, so that it may currently be read whether a production company produces excess energy, or whether the customers of the company must supplement with energy from other suppliers.

What is claimed is:

1. A device for metering and displaying metered consumption at a place of consumption, said device comprising
   a recording and calculating unit that receives regular measurements of consumption, records said measurements, calculates an immediate consumption, stores said measurements, calculates an accumulated consumption from said measurements, and calculates an average consumption from said measurements, said recording and calculating unit being adapted to calibrate automatically based on said measurements, and
   a display comprising a first display unit capable of displaying, on a percentage scale, a relationship between said calculated accumulated consumption and said calculated average consumption for a selected period of time.

2. A device for metering and displaying metered consumption according to claim 1, wherein a period of time for calculating said average consumption and a period of time for calculating said accumulated consumption are the same, and wherein said periods are one of the group consisting of 24 hours, one week and one month.

3. A device for metering and displaying metered consumption according to claim 1, wherein the first display is a column comprising a plurality of linearly arranged light-emitting diodes.

4. A device for metering and displaying metered consumption according to claim 1, wherein said recording unit further comprises a pulse generator, and wherein said recording units records said immediate consumption when said pulse generator initiates a measurement, and wherein said pulse generator initiates a measurement every second.

5. A device for metering and displaying metered consumption according to claim 1, further comprising an interface for connection to a computer for exchange of data between said device and the computer.

6. A device for metering and displaying metered consumption according to claim 1, further comprising an operating panel for controlling said display.

7. A device for metering and displaying metered consumption according to claim 1, wherein said operating panel comprises two keys formed as oppositely directed arrows.

8. A device for metering and displaying metered consumption according to claim 1, wherein the display comprises a second display unit capable of displaying a relationship between said immediate consumption and a selected reference consumption on a percentage scale from 0–100%, wherein the selected reference consumption is a maximum recorded power, and corresponds to 80% on the scale.

9. A device for metering and displaying metered consumption according to claim 8, wherein the second display is a column display comprising a plurality of linearly arranged light-emitting diodes.

10. A device for metering and displaying metered consumption according to claim 1, wherein said accumulated consumption is displayed on said first display unit on an scale from 0–200%, where 100% corresponds to said calculated average consumption.

11. A device for metering and displaying metered consumption according to claim 10, wherein the scale comprises LEDs that emit light in a first colour on a lower half of said scale, and LEDs above 100% on said scale that emit light in a second colour.

12. A method of metering and displaying metered consumption at a place of consumption, comprising the steps of
    recording regular measurements of consumption, automatically performing a calibration based on said measurements, calculating an immediate consumption from said measurements, storing said measurements, calculating an average consumption, calculating an accumulated consumption, displaying on a first display on at least one percentage scale a relationship between said accumulated consumption and said calculated average consumption for a selected period of time.

13. A method of metering and displaying metered consumption according to claim 12, wherein said calculated accumulated consumption is displayed on said first display unit on an scale from 0–200%, where 100% corresponds to said calculated average consumption.

14. A method of metering and displaying metered consumption according to claim 12, wherein a period of time for calculating said average consumption and a period of time for calculating said accumulated consumption are the same, and wherein said periods are 24 hours.

15. A method of metering and displaying metered consumption according to claim 12, wherein a period of time for calculating said accumulated consumption is one of the group consisting of one week and one month, and wherein the method further comprises the step of storing the accumulated consumption a lapse of the interval of time such that a selected accumulated consumption may be read and displayed as a history on said first display.

16. A method of metering and displaying metered consumption according to claim 15, further comprising the steps of displaying, on a second display unit an age of said selected accumulated consumption that is displayed as a history on said first display unit.

17. A method of calibrating a device for metering and displaying metered consumption at a place of consumption, said device comprising:

- a recording and calculating unit that receives regular measurements of consumption, records said measurements, calculates an immediate consumption, stores said measurements, calculates an accumulated consumption from said measurements, and calculates an average consumption from said measurements, and
- a display comprising a first display unit capable of displaying, on a percentage scale, a relationship between said calculated accumulated consumption and said calculated average consumption for a selected period of time, the method comprising the steps of, after installation of said device, accumulating periodic measurements, and automatically calibrating said device through said accumulation of periodic measurements.

18. A device for metering and displaying metered production at a place of production, said device comprising

- a recording and calculating unit that receives regular measurements of production, records said measurements, calculates an immediate production, stores said measurements, calculates an accumulated production from said measurements, and calculates an average production from said measurements, said recording and calculating unit being adapted to calibrate automatically based on said measurements, and
- a display comprising a first display unit capable of displaying, on a percentage scale, a relationship between said calculated accumulated production and said calculated average production for a selected period of time.

* * * * *